US011698394B2

(12) United States Patent
Vangerven et al.

(10) Patent No.: US 11,698,394 B2
(45) Date of Patent: Jul. 11, 2023

(54) HOUSING VIA FOR SEMICONDUCTOR CURRENT SENSOR

(71) Applicant: Melexis Technologies SA, Bevaix (CH)

(72) Inventors: Tim Vangerven, Tessenderlo (BE); Appolonius Jacobus Van Der Wiel, Tessenderlo (BE)

(73) Assignee: MELEXIS TECHNOLOGIES SA, Bevaix (CH)

( * ) Notice: Subject to any disclaimer, the term of this patent is extended or adjusted under 35 U.S.C. 154(b) by 426 days.

(21) Appl. No.: 16/826,869

(22) Filed: Mar. 23, 2020

(65) Prior Publication Data

US 2020/0300898 A1    Sep. 24, 2020

(30) Foreign Application Priority Data

Mar. 22, 2019    (EP) .................................. 19164768

(51) Int. Cl.
*H01L 21/768*    (2006.01)
*H01L 23/522*    (2006.01)
(Continued)

(52) U.S. Cl.
CPC ....... *G01R 19/0092* (2013.01); *G01R 15/202* (2013.01); *H01L 21/4825* (2013.01); *H01L 21/565* (2013.01); *H01L 21/76898* (2013.01); *H01L 23/4952* (2013.01); *H01L 23/49541* (2013.01); *H01L 24/05* (2013.01); *H01L 24/48* (2013.01); *H01L 2224/05554* (2013.01);
(Continued)

(58) Field of Classification Search
CPC ......................... G01R 19/0092; G01R 15/207; G01R 15/148; G01R 15/205; G01R 15/202; H01L 21/4825; H01L 21/565; H01L 21/76898; H01L 23/4952; H01L 23/49541; H01L 24/05; H01L 24/48; H01L 2224/05554; H01L 2224/48091; H01L 2224/48247; H01L 2224/16145; H01L 2224/73265; H01L 2224/48465; H01L 2924/00014; H01L 2924/00
See application file for complete search history.

(56) References Cited

U.S. PATENT DOCUMENTS

2010/0019370 A1\*    1/2010    Pressel ................ H01L 23/5384
                                                    257/E23.116
2012/0112365 A1\*    5/2012    Ausserlechner ....... G01R 15/20
                                                    438/126
(Continued)

FOREIGN PATENT DOCUMENTS

EP    3333580 A1    6/2018

*Primary Examiner* — Marcos D. Pizarro
*Assistant Examiner* — Tenley H Schofield
(74) *Attorney, Agent, or Firm* — Workman Nydegger (57) ABSTRACT

A current sensor is described comprising an integrated circuit for sensing electric currents comprising an active side, the active side comprising at least one sensing element and at least one contact pad and a housing comprising material embedding the integrated circuit arranged for allowing electric connection to the at least two contact pads of the active side of the integrated circuit. The housing comprises at least one conductive via disposed outside the integrated circuit and connected to the at least one contact pad, for distributing signals from the at least one contact pad through the housing away from the active side of the integrated circuit.

13 Claims, 7 Drawing Sheets

(51) Int. Cl.
    *G01R 19/00*     (2006.01)
    *G01R 15/20*     (2006.01)
    *H01L 21/48*     (2006.01)
    *H01L 21/56*     (2006.01)
    *H01L 23/495*     (2006.01)
    *H01L 23/00*     (2006.01)
(52) U.S. Cl.
    CPC ............... *H01L 2224/48091* (2013.01); *H01L 2224/48247* (2013.01)

(56) References Cited

U.S. PATENT DOCUMENTS

| | | | | |
|---|---|---|---|---|
| 2013/0049746 | A1* | 2/2013 | Strutz | G01R 33/0047 |
| | | | | 257/E29.323 |
| 2013/0221452 | A1* | 8/2013 | Strothmann | H01L 24/96 |
| | | | | 438/48 |
| 2016/0299200 | A1* | 10/2016 | Taylor | H01L 27/22 |
| 2017/0200666 | A1* | 7/2017 | Hable | H02M 3/158 |
| 2017/0263516 | A1* | 9/2017 | Ishimaru | H01L 24/00 |
| 2018/0149677 | A1* | 5/2018 | Milano | G01R 19/0092 |
| 2018/0211917 | A1* | 7/2018 | Hoegerl | H01L 24/48 |

* cited by examiner

HOUSING VIA FOR SEMICONDUCTOR CURRENT SENSOR

FIELD OF THE INVENTION

The invention relates to the field of electrical sensors. More specifically it relates to integrated current sensors having high voltage isolation properties, and their fabrication methods.

BACKGROUND OF THE INVENTION

Current sensing, e.g. for controlling operation, is required in a number of applications, such as for example solar cell inverters, car batteries, servo drives, E-bikes and alike. It often is important to provide current sensors in a compact manner. One way to obtain compact current sensors is by integrating them in the electronic device. In such configuration, Typically a leadframe is present as well as an integrated circuit or chip, such as semiconductor chip, mounted on the leadframe. When the chip, which typically may be an IC with hall plate elements, is used in combination with a current carrying conductor, allowing the generation of a magnetic field, the chip acts as a sensor. Typically, electronics for sensing and processing the sensing signal can be present, whereby an output signal can be generated as function of the sensed signal.

For a magnetic field sensing element, such as a Hall-based integrated current sensor, it is important to have a high sensitivity with high signal to noise ratio. The distance from the Hall plate to the current carrying conductor therefore is an important parameter and should be as close as possible to have an optimum magnetic flux. Ideally the active CMOS side including the sensing element should face the current conductor to minimize this distance.

However, in such electronic devices high working voltages typically occur, such as for example working voltages of 600V or higher. The integrated current sensor requires high voltage isolation breakdown strength over lifetime, to ensure proper device functioning as well as safety for maintenance. This is contradictory with the requirement of positioning the current sensor as close as possible to the conductor for which the current is to be measured, whereby the electric field is increased. Special care therefore needs to be taken in terms of material selection, in order to reduce chances of breakdown due to voltage.

Moreover, the active CMOS side usually includes contact pads for signal interchange, which are difficult to access when the active CMOS side faces the conductor carrying the current. EP3333580 provides connections through the CMOS, but special design and expensive processing is usually necessary.

SUMMARY OF THE INVENTION

It is an object of embodiments of the present invention to provide a sensing device or component for a current sensor, a current sensor and a method of fabrication, which allows rerouting in an effective and reliable way signals from the sensing element, while allowing keeping the active side close to the current-carrying element, thus providing high signal-to-noise (S/R) ratio.

In a first aspect, the present invention provides a current sensor comprising:

an integrated circuit for sensing electric currents comprising an active side including at least one sensing element and at least one contact pad, a housing comprising material embedding, for example for protecting and isolating, the integrated circuit; the housing is arranged for allowing electric connection to the at least two contact pads of the active side of the integrated circuit, The housing comprises at least one conductive via disposed outside the integrated circuit and connected to the at least one contact pad, for distributing signals from the at least one contact pad through the housing away from the active side of the integrated circuit.

It is an advantage of embodiments of the present invention that reliable contact vias are obtained. In some embodiments, the housing may further comprise a first side and a second side, the first side being closer to the active side of the integrated circuit than the second side. The conductive vias are arranged for distributing signals from the active side of the integrated circuit to the second side of the housing. The electric connection between the contact pad and the conductive via may be a resistive contact.

In some embodiments of the present invention, the current sensor further comprises a redistribution layer (RDL) for electrically connecting one or more contact pads to the conductive vias, for example to one via per pad.

It is an advantage of embodiments of the present invention that the positioning of the vias and of the contact pad can be done relative to each other with great freedom, thus allowing improving and optimizing design. The redistribution layer may be positioned at the same side of the housing as the contact pad, e.g. the first side.

In some embodiments of the present invention, the current sensor further comprises a primary leadframe for carrying current for sensing and a set of electric contacts for signal interchange. The active side of the integrated circuit faces the primary leadframe for sensing current therefrom. For example, the integrated circuit may be mounted upside down on the leadframe. The integrated circuit may be electrically isolated from the primary leadframe. The at least one contact pad of the integrated circuit is further electrically connected to electric contacts of the set through the conductive vias, for transferring measurement signals to the secondary leadframe. The secondary lead frame may be connected to the redistribution layer or the secondary lead frame may be connected directly to the vias or a contact pad on the PCB element.

It is an advantage of embodiments of the present invention that a reliable electric contact is provided between the contact pad on the active side of the integrated circuitry and the pins of the secondary leadframe through the backside of the housing. It is a further advantage that, by mounting the integrated circuit upside down over the current-carrying conductor, high S/N ratio can be obtained.

In some embodiments of the present invention, the current further comprises an RDL, for example on the second side of the housing, providing electric connection between the conductive via and the electric contacts of the set.

It is an advantage of embodiments of the present invention that electric connections are not constrained by the relative positioning of the contacts of the set relative to the conductive vias, but it can be brought close to each other. This allows, for example, using shorter wires in the wire bonding, and reducing crossing or overlapping of wires, reducing chance of accidental contact.

Further, the current sensor may comprise isolation material between the active side and the primary leadframe, for example at least one polyimide layer and/or a polyimide tape. It is an advantage of embodiments of the present invention that a high voltage insulation can be obtained. It is a further advantage that the distance between the current sensing device and the primary leadframe can be well controlled and tuned. It is a further advantage that suitable electrical isolation is provided throughout the life of the device.

In a second aspect, the present invention relates to a method of fabrication of a sensor comprising
  providing an integrated circuit with an active side, the active side comprising at least one sensing element and at least two contact pads,
  disposing at least the integrated circuit on a carrier substrate,
  providing a housing including at least one conductive via, by overmolding the integrated circuit, the overmolding being adapted for allowing provision of electric connection to the at least one contact pad of the active side of the integrated circuit,
  providing electric connection between at least one of the contact pads and the at least one conductive via.

Thus, a sensor can be obtained where electric signals generated on the active side of the integrated circuit can be redirected through the housing and away from the active side.

It is an advantage of embodiments of the present invention that electric connection can be provided between contact pads, for interchange of signals (powering signals, measurement signals) between the integrated circuit and an output, even if the contact pads are on the active side of the integrated circuit and the active side faces and is attached to the conductor through which the measured current flows.

In some embodiments of the present invention, at least one conductive via is provided by fabricating at least one conductive via on a dielectric substrate, and separating a portion of dielectric material embedding conductive material. This at least one prefabricated conductive via and the integrated circuit are subsequently overmolded.

It is an advantage of embodiments of the present invention that the one or more individual conductive vias can be provided, for example in a PCB substrate, and accurately positioned on the carrier substrate. The electric connection may be a resistive connection.

In some embodiments of the present invention, a primary leadframe is provided, including a conductor for providing current to be measured. Then, the housing is assembled, where the integrated circuit thereon with its active side faces the primary leadframe. The integrated circuit is electrically isolated from the primary leadframe.

It is an advantage of embodiments of the present invention that high signal/noise ratio can be provided by providing the sensing element facing the current to be sensed, while at the same time providing high breakdown strength by the electric isolation.

In some embodiments of the present invention at least one layer of isolation material is provided between at least the primary leadframe and the integrated circuit, for example a layer of polyimide, and/or a polyimide tape.

It is an advantage of embodiments of the present invention the thickness can be accurately controlled, thus controlling the distance between the primary frame and the sensing element.

In some embodiments of the present invention, a set of electric contacts is provided. At least one of the electric contacts is electrically connected to at least one conductive via.

It is an advantage of embodiments of the present invention that signals from the integrated circuit can be sent to a leadframe connected to a further unit for signal processing.

In some embodiments of the present invention, in order to electrically connect the electric contacts to the conductive via, a RDL is provided on the conductive via, so the RDL and the contacts of the set are electrically connected.

It is an advantage of embodiments of the present invention signals that the RDL facilitates connection to the vias, thus allowing great freedom of positioning of the vias.

In some embodiments of the present invention, the electric connection between the contact pad and the conductive via comprises providing a redistribution layer in electric contact with the conductive via and the contact pad.

It is an advantage of embodiments of the present invention that a standard method can be used, e.g. substrate transfer, for providing electric connection. It is a further advantage that the positioning of the vias and of the contact pad can be done relative to each other with great freedom, thus allowing improving and optimizing design.

Providing a housing may comprise providing the housing with a first side and a second side, the first side being closer to the active side of the integrated circuit than the second side, the conductive vias allowing distributing signals from the active side of the integrated circuit to the second side of the housing. The method may further comprise providing a redistribution layer on the second side of the housing.

In some embodiments of the present invention, the one or more redistribution layers are provided by metal deposition.

It is an advantage of embodiments of the present invention that metal deposition is a well-known fabrication technique. It allows for example copper deposition which shows suitable properties and it is relatively inexpensive as compared to for example gold. The Cu RDL may be finished with NiAu or NiPdAu or PdAu. The bonds may be wire-bonded on the RDL.

Before metal deposition, in some embodiments of the present invention, a passivation layer can be provided prior to metal deposition.

It is an advantage of embodiments of the present invention that the passivation layer acts as stress buffer.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In a first aspect, the present invention relates to a sensor including an integrated circuit with at least one sensing element, the sensing element facing towards the current-carrying conductor, for high sensitivity. For example, the integrated circuit may be mounted upside down on the conductor. The electrical contacts (at least two contact pads, e.g. for connection to bias voltage VDD and for grounding GND) on the side facing said leadframe are rerouted through embedding material containing the sensing element. The rerouting is provided with conducive vias outside of the integrated circuit, for example at least one via, e.g. through-mold via (TMV). This ensures electric connection to the electric contacts or pins of a set thereof, obtained e.g. from a secondary leadframe, for signal output, via wirebonding from the backside of the housing. The electric connection may be for example a resistive contact, e.g. via conducting material.

Between the leadframe a voltage isolation material can be inserted (e.g. polyimide tape) to provide high dielectric insulation.

The sensor comprises at least one sensing element, which is included in an integrated circuit with connections for providing signals generated in the circuit from the response of the sensing element, an output for sending the signals to external units for analysis, display, storage, etc., and an input for providing currents to be measured.

The sensing element may sense current running through a conductor. In particular, it may sense the current with no physical contact with the measured conductor. Voltage isolation can be placed between the measured conductor and the at least one sensing element. Such sensing elements may provide a measurable response to, for example, an electromagnetic field or changes thereof, which is produced by an electric current running through the measured conductor.

The response is translated into signals which need to be processed for storing, analysis or display. Thus, the signals need to be routed to the sensor output. However, the need of placing the sensing element as close as possible to the measured conductor hinders this routing, as the contact pads of the integrated circuit are usually in the same side of the circuit as the sensing element, and these contact pads are necessary connections of the integrated circuit for signal interchange and for powering the circuit, for example.

For this reason, the sensor further comprises a housing including the integrated circuit, and further conductive structures, or vias, for routing the signals from the integrated circuit to the output. The conductive vias run through the housing, but outside the integrated circuit. They include at least a first end for electrically connecting to a contact pad of the plurality thereof of the circuit, and a second end for connecting to the output, the second end of the via being for example opposite to the first end. The second end is laid out away from the side of the integrated circuit facing the measured conductor. The housing provides fixation of the via and the integrated circuit, and moreover it can provide protection and/or isolation (e.g. thermal, radiation, and/or electric isolation).

The sensor may include an output connected to the via of the subcomponent comprising the housing, integrated circuit and via.

In some embodiments, the sensor may include also a conductor over which the subcomponent is laid out in order to sense current through the conductor, the conductor thus acting as an input of the sensor. The conductor may be part of a leadframe, named "primary leadframe".

In some embodiments, the output is packaged with the sensor in the same package. In some embodiments, the conductor may also be in the same package. Thus, a packaged sensor (sometimes known as "integrated sensor") can be provided.

In some embodiments of the present invention, the sensing elements comprise magnetic sensors which sense changes in the field around the measured conductor, with no need of resistive or physical contact. For example the sensing elements may comprise a Hall element, e.g. two or more Hall elements. The present invention is not limited to Hall elements, and other types of sensing elements can be used.

Figure 3:
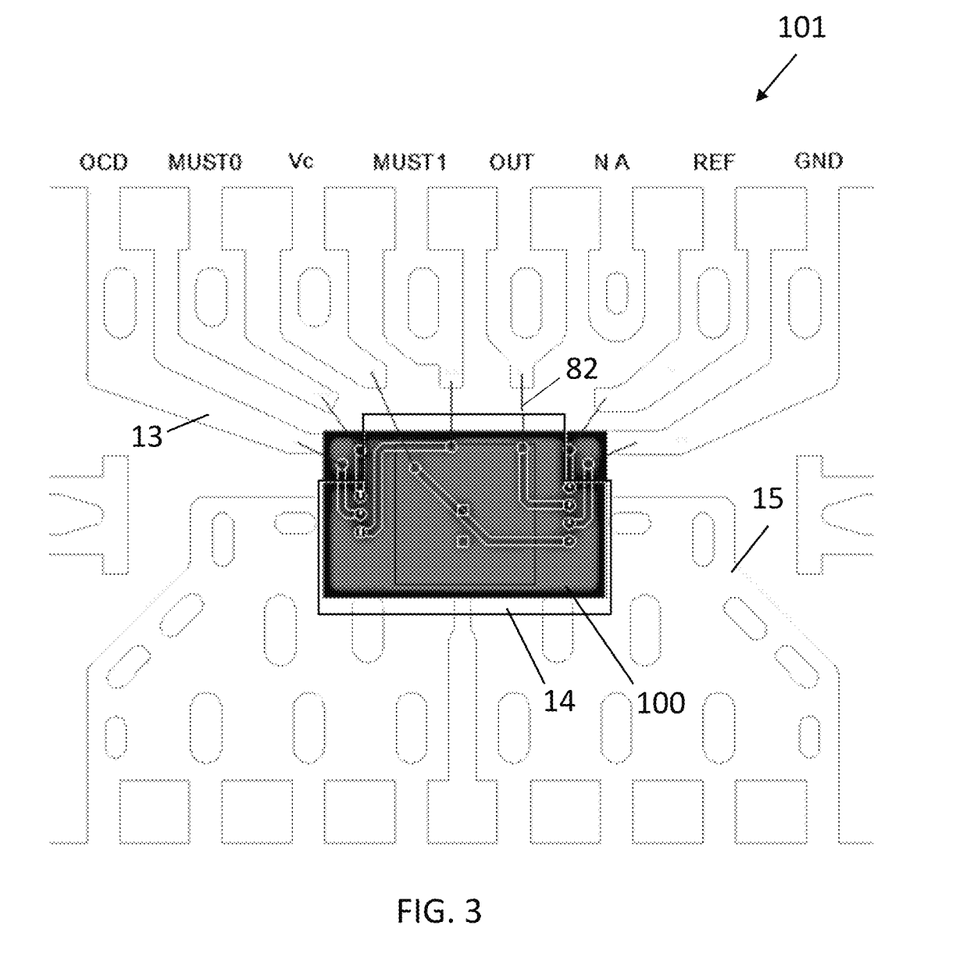
FIG. 3 illustrates a current sensor including contacts for signal interchange and a conductor for carrying measurable current in a leadframe, in accordance with embodiments of the present invention.

In order to illustrate the present invention, two views of an exemplary subcomponent of the sensor are shown. The subcomponent includes the integrated circuit with the sensing element and the housing. The sensor is shown in FIG. 3 including the subcomponent and two leadframes for current measurement and for signal output.

Figure 1:
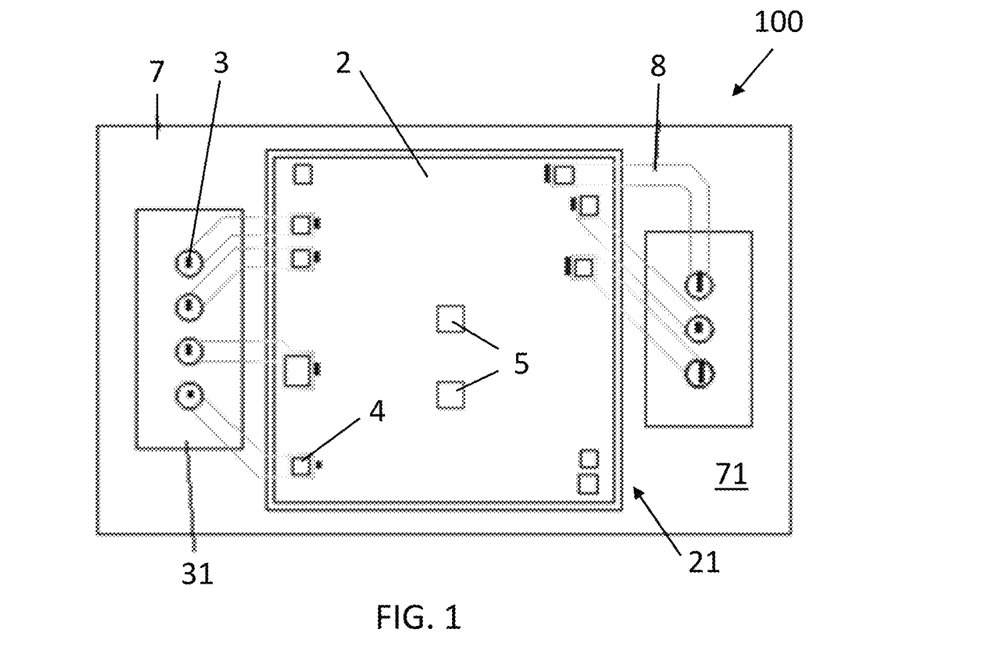
FIG. 1 and FIG. 2 illustrate the active side and backside, respectively, of a subcomponent of a current sensor in accordance with embodiments of the present invention.

FIG. 1 shows the view of the subcomponent 100 of the sensor from the topside, facing the sensing element 5 being a couple of Hall elements, and a plurality of contact pads 4 of the integrated circuit 2. Conductive vias 3 are laid out at the sides of the integrated circuit 2, all of which are embedded, for example overmolded, by the material of the housing 7.

The integrated circuit 2 may comprise a semiconductor integrated circuit. It may be formed in a silicon die. For example, it may be a CMOS circuit.

The housing 7 may include materials for protecting and/or electrically isolating the embedded integrated circuit 2. Such materials may comprise resin, such as epoxy resin, or any other suitable mold compound.

The conductive vias 3 are shown from the top. It may comprise any suitable conductive material, e.g. metal such as copper or the like. In some embodiments, the conductive material may be embedded in a vias substrate 31, for example a suitable dielectric substrate. For example, said substrate may have good adhesion and compatibility with the material of the housing 7 and the conductive material of the via. In some embodiments the via substrate 31 may be a PCB substrate, which have good compatibility with most conductors and molding compounds. In the example of the figure, two sets of conductive vias 3 are laid out on opposite sides of the integrated circuit, each set including a PCB substrate with four and three conductive vias respectively, for connecting to seven of the plurality of contact pads 4 present in the integrate circuit 2. Providing vias in a substrate allows an accurate positioning.

In some embodiments, the subcomponent includes an overmolded housing 7 formed by compression mold, and it includes a silicon die with an integrated circuit 2 and through-mold vias (TMV) being the conductive vias 3.

Figure 2:
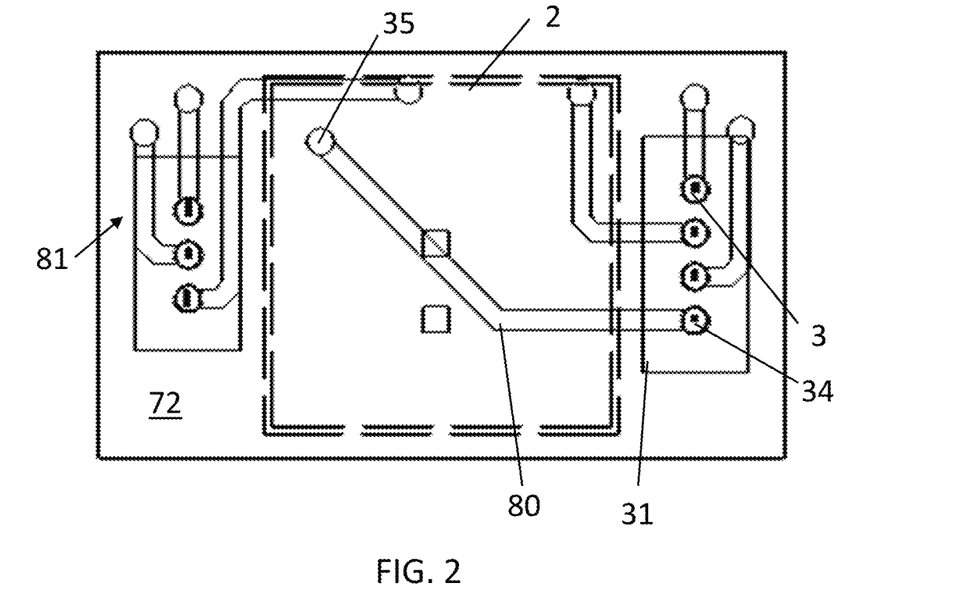

In some embodiments of the present invention, the contact pads 4 are provided in the integrated circuit. In the example of FIG. 1 and FIG. 2, a plurality of contact pads 4 are shown on the same side of the circuit as the sensing element 5, which is the side that should be closest to the measured conductor, or "active side" 21 of the integrated circuit 2.

The signals from a contact pad 4 of the integrated circuit 2 can be routed to a conductive via 3 for example by providing a conductive track or the like in electric contact with the conductive via 3 on one extreme and on its opposite extreme to the contact pad 4. A plurality of contact pads can be contacted to a plurality of vias, in accordance with the needs of circuit design.

In some embodiments of the present invention, for example where the at least two contact pads 4 are provided on the active side 21 of the integrated circuit 2, the conductive tracks may be part of a redistribution layer (RDL) 8 provided over at least part of the active side 21 of the integrated circuit 2. In some embodiments, the tracks of the RDL 8 are distal from the sensing elements, thus preferably not overlapping the sensing elements 5, or even close to them, so sensing is not obstructed by signal interference.

In some embodiments the RDL 8 is a metallization layer, optionally including a passivation layer (not shown in the pictures) between the RDL and the rest of the circuit or housing, acting as a stress buffer. The Cu RDL may typically be finished with NiAu or NiPdAu or PdAu. The bonds may be wirebonded on the RDL.

FIG. 2 shows the view of the subcomponent 100 of FIG. 1, on its flipped side or backside of the subcomponent 100. The integrated circuit is also shown, but with dashed lines, indicating that it is on the opposite side of the subcomponent 100.

The conductive vias 3 provide connections away from the active side 21 of the integrated circuit 2, in this case on the backside of the subcomponent 100. More specifically, the subcomponent of FIG. 1 and FIG. 2 includes a housing 7 comprising a first side 71 (facing the viewer in FIG. 1) and a second side 72 (facing the viewer in FIG. 2), the first side 71 being closer (e.g. being coplanar) to the active side 21 of the integrated circuit than the second side 72. The conductive vias 3 distribute signals from the contact pads 4 in the active side 21 of the integrated circuit 2 to the second side 72 of the housing. Because FIG. 2 shows the opposite side of FIG. 1, and the conductive vias 3 are in this particular embodiment vertical columnar conductive vias 3, the layout of the conductive vias 3 is the mirror image of the FIG. 1. In one embodiment, non vertical/non columnar TMVs also may be used. A multilayer pcb where internal rerouting layers are present also may be used.

Connections to the output can be provided directly on the via end, optionally on pads provided thereon, e.g. by wiring and/or soldering. In other embodiments, the electric contact can be provided to the conductive vias 3 via an RDL 81, thus allowing greater design flexibility and simplification of connections and wiring. As shown in FIG. 2, the via 34 can be contacted by wiring to a pad 35 disposed at the other side of the housing, thanks to the track 80 of the RDL 81. Because the RDL 81 is laid out on the opposite side (second side 72) of the housing 7, the freedom of design is large, as there is no risk to affect sensing elements (shown in FIG. 2 with the track T overlapping one of the Hall plates).

FIG. 3 shows a current sensor 101 including a subcomponent 100, including a housing embedding, e.g. overmolding, an integrated circuitry and conductive vias 3, such as the one shown in FIG. 1 and FIG. 2. It further comprises a primary leadframe 15 for providing current to be measured, thus the primary leadframe being an electric conductor, and a secondary leadframe showing the set 13 of electric contacts for providing electrical contact to the silicon die and for acting as a signal interchange (e.g. for powering the circuit) and signal output. In some embodiments of the present invention, the electric contacts of the set 13 are separated and isolated from each other as single contacts or pins.

The electric connection between the via 3 and the set 13 may be done by wire. For example, wiring 82 may connect the electric contacts of the set 13 with the RDL 81 which is in turn connected to the via 3. In some embodiments of the present invention, the wires 82 can be provided directly between the contacts of the set 13 and the vias 3. The wires 82 may be provided by wire bonding, for example to the backside of the subcomponent 100 (at the second side 72 of the housing 7) thanks to the conductive vias, e.g. TMVs. Specifically the signals are extracted to the output via the contact pad 4, optionally an RDL 8, the via 3, optionally a further RDL 81 (see FIG. 2), the wiring 82 and finally the electric contacts of the set 13.

The set 13 may comprise electric contacts such as pins for signal interchange, in particular signal output, between an external unit (such as a readout unit) and the integrated circuit 2. For example, a connection to ground GND and to a reference voltage can be provided through the housing 7 in accordance with embodiments of the present invention to the pads of the integrated circuit; other connections for signal output can be added, etch. In particular, FIG. 3 shows connections to OCD, MUST0, Vc, MUST1, OUTn REF and GND. Other embodiments may include different set 13 and different requirement for connection.

The subcomponent 100 may be electrically isolated (e.g. voltage isolation) from either or both leadframes 13, 15. This reduces possibility of voltage breakdown of the integrated circuit. For example, isolation layers can be included on the first and/or second sides 71, 72 of the housing as explained below, and/or an additional insulation between the subcomponent 100 and either or both leadframes 13, 15, for example by insertion of a polyimide tape 14 on the leadframe, or any other suitable insulation material. A tape allows good control and tuning of the distance between the leadframes and the subcomponent 100, depending on the isolation and sensitivity properties and requirements.

Further, electric isolation between the primary leadframe 15 and the electric contacts of the set 13 is governed by the material forming the housing 7 of the subcomponent 100 (e.g. the mold compound) and by distance control between the leadframe 15 and the set 13.

In some embodiments, the sensor 101 is an integrated current sensor, for example a packaged current sensor.

In a second aspect, the present invention provides a method of manufacture the subcomponent of the current sensor, and a current sensor, in accordance of embodiments of the first aspect of the present invention. The method includes providing an integrated circuit 2 with a sensing element 5 and at least two contact pad 4. The contact pads may be included in the active side 21 of the circuit 2, i.e. the side comprising the sensing element 5.

The method includes disposing the integrated circuit 2 on a carrier substrate 1, and then providing 204 the housing 7 with at least one via 3.

In some embodiments, providing housing 7 with at least one via 3 may comprise providing a separate via 3 together with the integrated circuit 2, or providing a housing 7 embedding the integrated circuit 2 and then providing a via 3 through the material of the housing, so the via does not pass through the integrated circuit, e.g. a TMV.

As a result, a housing 7 embedding circuitry and vias is obtained. The contact pads 4 of the integrated circuit are connected to one end of the vias 3. The other end of the vias is then connected, e.g. wired, to an output.

The circuit can be disposed with the sensing element facing the conductor (or primary leadframe) for which the current is measured, at a distance such that the S/N ratio is high while at the same time protecting the circuit from influences of the voltage of the primary leadframe. For example, insulating layers such as polyimide layers can be included between the primary leadframe and at least the integrated circuit. The layers can be provided while ensuring that the electric contacts (both sides of the vias, the contact pads, and/or contact zones of tracks, e.g. of RDL 81) are not blocked. For example, if they are covered by insulation material, such as mold or polyimide, they may be opened before providing the further wires or in general conductors.

FIG. 4 to FIG. 9 shows the steps of an exemplary fabrication process of the sensor in accordance with embodiments of the present invention. The cross section of a schematic sensor is shown. FIG. 10 shows an exemplary manufacturing process flow.

First, an integrated circuit is provided 201, including sensing elements and contact pads. Then, the integrated circuit is disposed 203 on a carrier substrate. Optionally, a conductive via 3 can be also provided thereon. Then, a housing is provided 204 including at least one via 3, for example by overmolding both integrated circuit and via, or by overmolding the integrated circuit 2 forming the housing 7, and then providing the at least one via 3.

Figure 4:
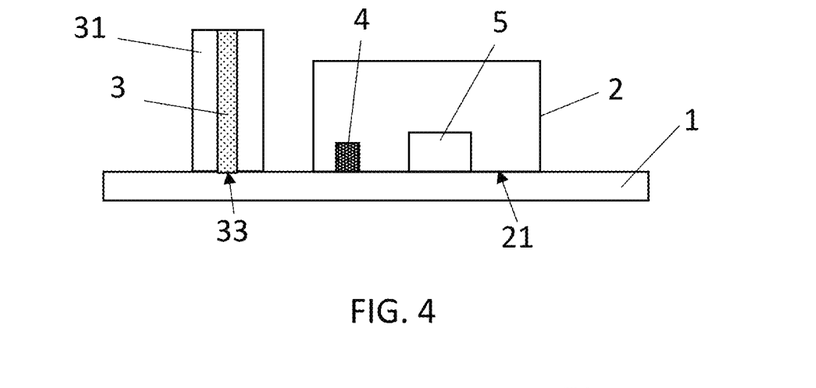
FIG. 4 to FIG. 9 illustrate different steps of fabrication of a current sensor in accordance with embodiments of the present invention.

FIG. 4 shows the step of disposing 203 the integrated circuit 2 and, optionally, the conductive vias 3, on a carrier substrate 1.

For example, such via 3 may be a conductive via manufactured on small scale PCB substrates. This may include providing conductive material as vias in a dielectric substrate, e.g. a PCB substrate, and separating 212 a portion of dielectric material embedding conductive material, thus providing at least one conductive vias 3 on a vias substrate 31. The conductive vias 3 can be simply picked and positioned on the substrate 1. For example, the vias 3 may include a plurality of conductors embedded in the same vias substrate 31.

The vias may be positioned with one of its ends 32, 33 in contact with the carrier substrate 1. These ends 32, 33 may comprise further pads, for example for improving electric contact. The integrated circuit is positioned with the sensing element 5 facing the carrier substrate 1, so the active side 21 (including also the contact pads 4) is in contact with the carrier substrate 1.

The present invention is not limited to providing at least one separate via together with the integrated circuit on the substrate. Alternatively or additionally, vias 3 can be formed directly on the housing 7 shown in FIG. 5, as mentioned before.

Figure 5:
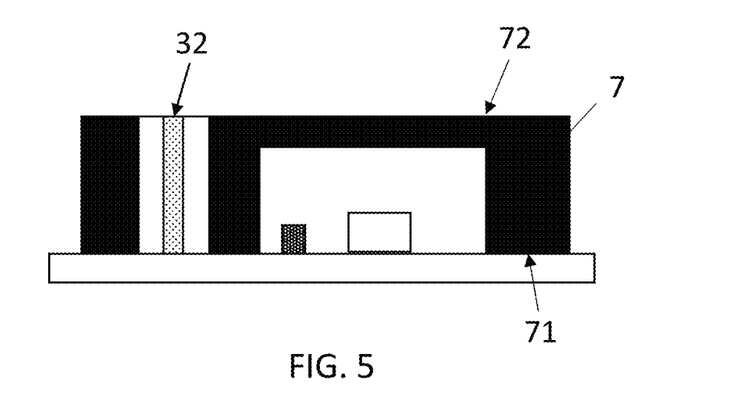

FIG. 5 shows the subsequent provision of housing 7, for example by overmolding of the integrated circuit 2 and optionally the conductive vias 3 with material, e.g. housing material for protecting and fixing at least the integrated circuit, e.g. molding material such as epoxy. Providing the housing is done so that no contacts are covered. If the contact pads 4 and/or the contact via end 32 become covered by for example molding material, it is necessary to open the mold.

In some embodiments, the carrier substrate 1 stops mold from covering regions of the active side 21 of the integrated circuit 2. The active side 21 and the first side 71 of the housing may form a single flush surface. However, in other embodiments, the active side 21 of the integrated circuit may be covered in mold. The first side 71 of the housing is the one closest to the active side 21 of the circuit 2. The first side 71 of the housing should be facing the primary leadframe. In this second case, part of the mold can be removed to reveal the contact pads 4 (and the via end 33, in case it is also covered).

This method allows well-known wafer level packaging technology to be advantageously used for providing a current sensor. For example, the components can be provided 214 via compression molding.

Figure 6:
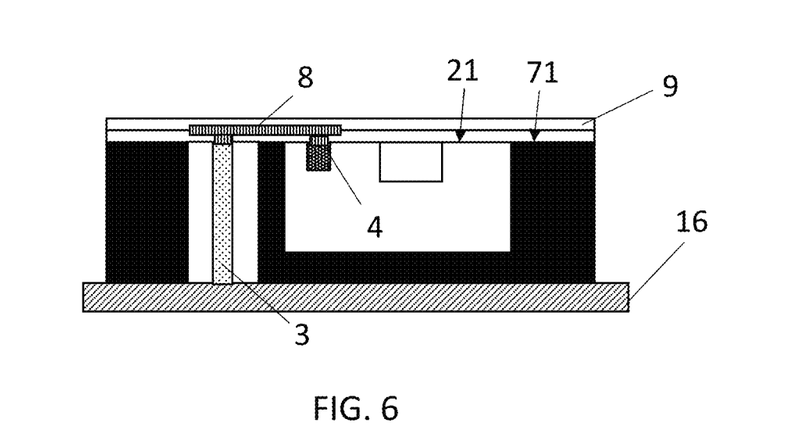

The housing and embedded elements are then transferred to a second carrier substrate 16 attached to the second side 72 of the housing, with flipping it upside down so the active side 21 of the integrated circuit 2 becomes available for further processing, as shown in FIG. 6. From this stage on, the processing of a plurality of subcomponents can be done simultaneously using a wafer, e.g. a 12 inch wafer. The processing can be analogous to RDL processing of a silicon wafer.

The conductive vias 3 are electrically connected 205 to contact pads 4. For example, RDL 8 can be provided 215 to connect the contact pads 4 with vias 3, for example on the first via end 33 facing the same side as the sensing element (the surface available after carrier transfer. The RDL 8 may include a conductive layer, e.g. a plurality of conductive tracks 80, e.g. a metal layer, for example copper layer. In some embodiments, it is possible to passivate 218 the housing and/or embedded elements, thus providing a passivation layer over which the RDL 8 is provided, which serves as a stress buffer.

Isolation can be provided also over the integrated circuit by including isolation material 9. For example, mold can be provided over the circuit, except on the contact pads 4. For example, one or more isolation layers 216 can be provided, after or before providing the RDL, or as intermediate steps between a multi-step provision of RDL 8. For example, a first layer of material for isolation (e.g. polyimide) can be provided, while leaving the contact pads 4 and vias ends 33 available for connection. Then a RDL 8 can be provided, followed by a second layer of material for isolation (e.g. polyimide), covering the conductive material of the RDL 8, thus reducing cross talk with any conductor (e.g. leadframe 15) facing the active side 21 of the integrated circuit.

At this point, the subcomponent 100 is provided with contact pads 4 and conductive vias 3 connected to each other, so electric signals generated on the active side 21 of the integrated circuit 2 can be redirected through the housing 7 and away from the active side 21. For example, the signals can be transferred from the active side of the integrated circuit, e.g. from the first side 71 of the housing, to the second side 72 of the housing opposite to the first.

Figure 7:
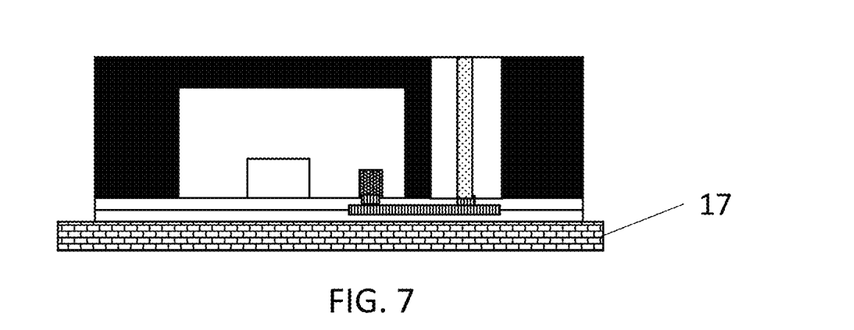

In some embodiments of the present invention, the housing and embedded elements are transferred once more to a different carrier substrate (e.g. a third carrier substrate 17) attached to the second side 72 of the housing, with flipping it backside up, so the active side faces the carrier substrate 17, or in other words, the second side 72 of the housing becomes available for further processing, as shown in FIG. 7.

Figure 8:
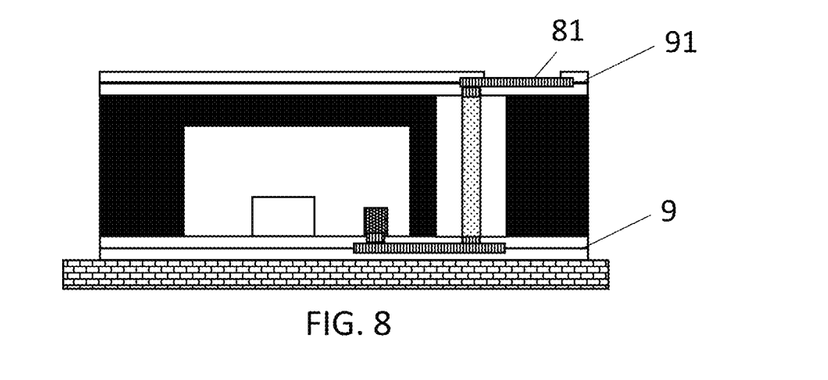

Then as shown in FIG. 8, an optional RDL 81 can be provided 217, for relaxing wiring conditions, thus allowing simplification of wiring layout and providing connections to the conductive vias 3 using conductive tracks as shown in FIG. 2 and FIG. 3, for bringing the contact point closer to the suitable pin of the set 13. As before, a passivation layer can be applied (by passivating 219 the second side 72 of the housing 7) prior to providing the RDL 81. Optional isolation material 91 in form of layers can also be used, thus improving the electric isolation.

Figure 9:
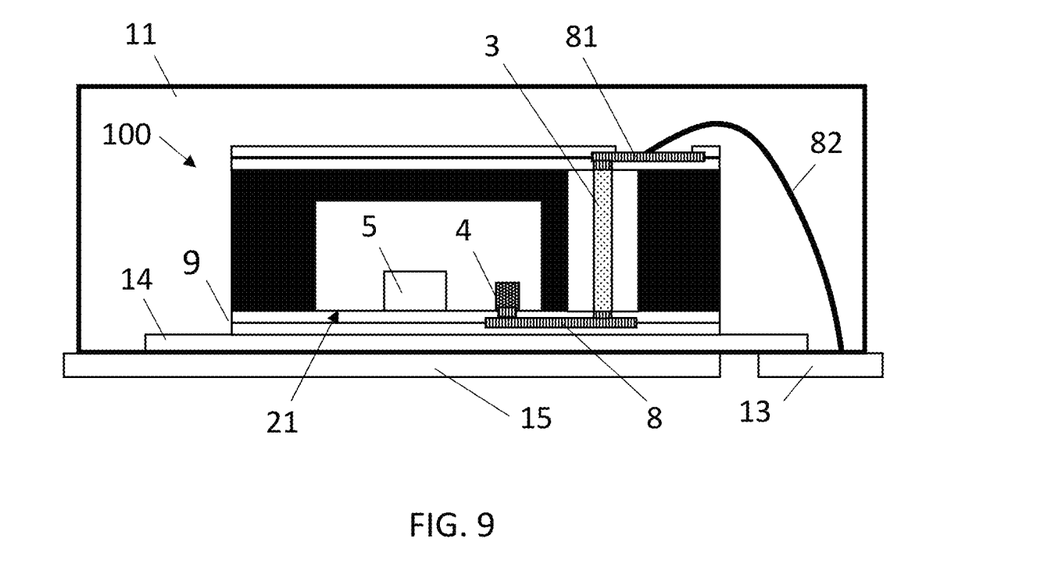
Figure 10:
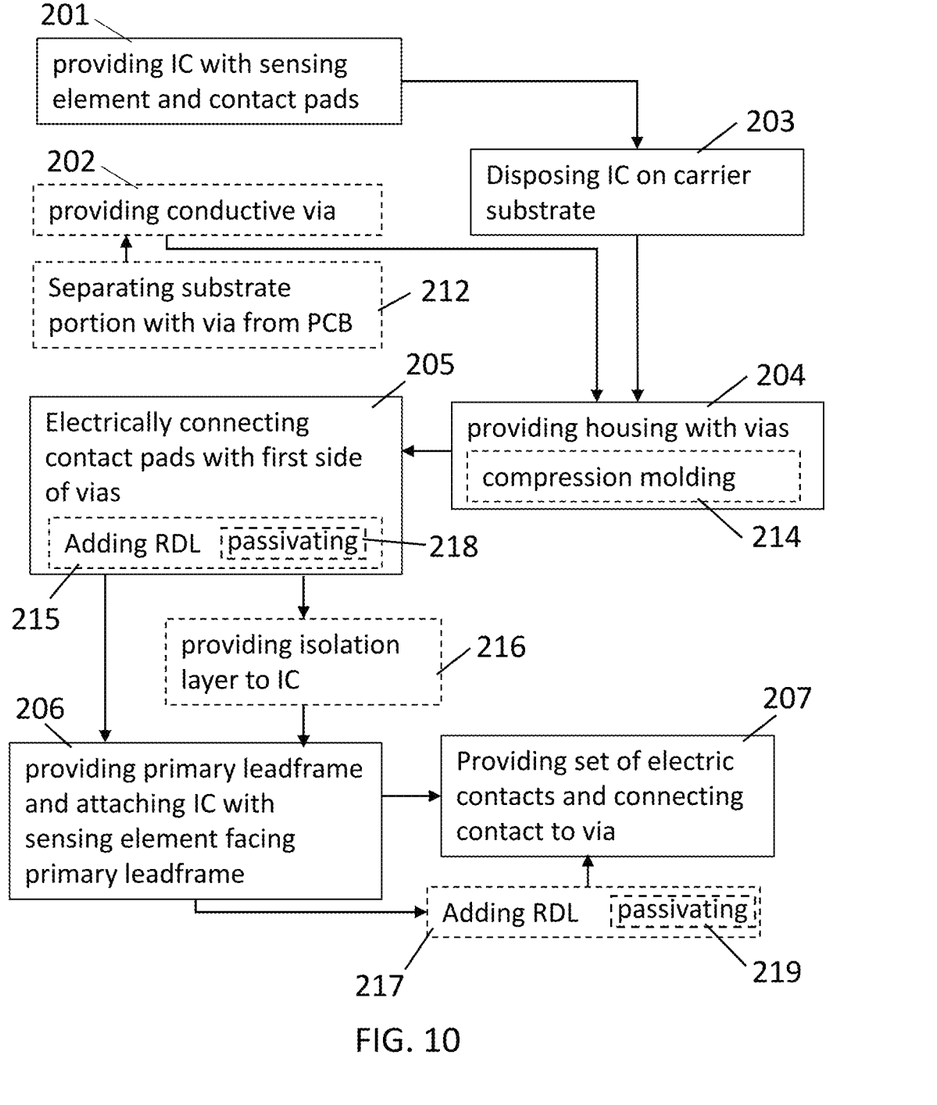
FIG. 10 is the schematic process for manufacturing a current sensor in accordance with embodiments of the present invention.

The subcomponent 100 is then connected to the electric contacts of the set 13 for signal interchange, e.g. for outputting signals from the subcomponent 100 as shown in FIG. 9.

More in detail, the subcomponent 100 can be assembled in a standard package 11 on the primary frame 15 through which the current to be sensed flows. The primary leadframe 15 with is provided 206 and the subcomponent 100 is assembled to the primary leadframe so the sensing element 5 of the integrated circuit 2 is positioned facing the conductor through which the current to be measured should flow, which is part of the primary leadframe 15. The integrated circuit 2 is protected from voltage breakdown by isolation between the integrated circuit and the leadframe, e.g. isolation layers 9. It can be assembled on an optional insulating tape 14.

Then, a set 13 of electric contacts is provided 207, which are electrically connected to the conductive vias 3, either by connecting them physically to the via end 32 thereof, where no RDL 81 is provided as in FIG. 7, or by connecting them to the optional RDL 81 as in FIG. 9. The electric connection can be provided by wire bond, e.g. wiring 82, for example by soldering to a pad provided on the via end 32.

The RDL 8 on the side of the subcomponent 100 facing the primary frame 15 allows electric connection of the conductive vias 3 to the contact pads. Thus, the electric contacts of the set 13 can interchange signals with the contact pads 4 even if the integrated circuit is mounted upside down, so the contact pad faces the leadframe. For example, these signals include current measurement signals provided by the integrated circuit 2 and its sensing element 5 sensing magnetic field, and changes thereof, due to the current through the conductor of the primary leadframe 15.

In an exemplary manufacturing method, prior to package assembly, a subcomponent is built with wafer level packaging technology. A CMOS circuit provided on a silicon die with Hall-based sensors is overmolded together with TMVs. The active CMOS side including the Hall plates is electrically connected to the vias with a metal RDL (e.g. copper). Prior to metal deposition, a passivation layer may be provided, acting as a stress buffer. The backside of the molded housing including the exposed via ends, optionally including via pads, can be reconfigured as well with a RDL including optional passivation layers. This approach enables wirebonding from the backside of the subcomponent, which may be further simplified by the optional RDL. Depending on the wiretype, the correct metallization finish can be selected.

In some embodiments, the present invention also relates to a similar sensor, wherein a further circuit, e.g. integrated circuit, is provided. The further circuit may for example be another semiconductor circuit. Such a semiconductor circuit may be a silicon-based circuit or may be any other type of semiconductor circuit such as for example a III-V semiconductor based circuit. In some embodiments, the first integrated circuit is a silicon based integrated circuit whereas the further circuit is a non-silicon-based circuit. In some embodiments thus heterogenous integration is obtained. The further circuit may be positioned next to, aside or adjacent the first integrated circuit. The active side of both circuits may be oriented in the same direction.

In some embodiments, the further circuit may for example be positioned next to the first integrated circuit. An example thereof is shown in FIG. 11 to FIG. 14, illustrating intermediate products during the manufacturing process of such a sensor.

Figure 11:
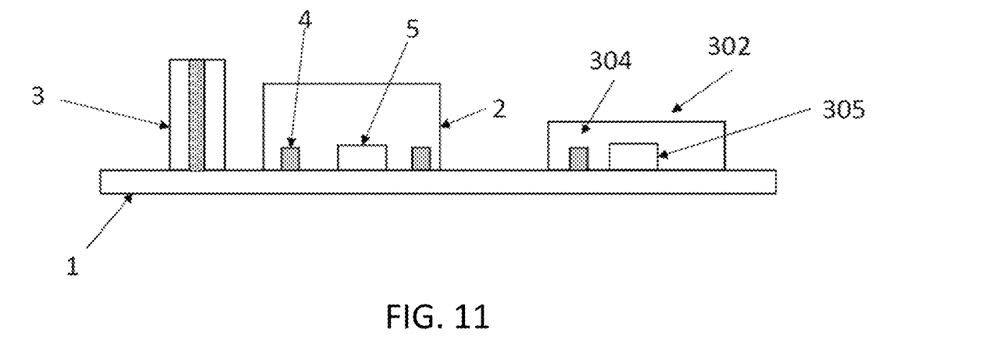
FIG. 11 to FIG. 14 illustrate different steps of fabrication of a current sensor in accordance with another embodiment of the present invention.

The first intermediate product shows the system after the picking and placing of the first integrated circuit and the further circuit is performed, as shown in FIG. 11. This step is similar as the step shown in FIG. 4, but the additional further circuit is also shown. The additional further circuit typically may comprise a further sensing element and at least one further contact pad, e.g. for powering the further sensing element. n this example, the further circuit 302 is shown, e.g. based on a semiconductor circuit made of a III-V compound, with a magnetic sensitive element 305 and at least one contact pad 304.

Figure 12:
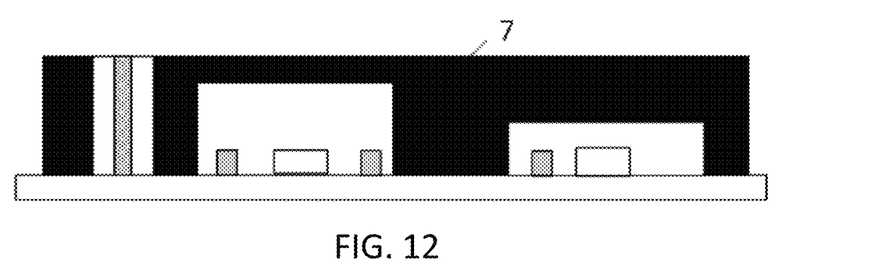

FIG. 12 illustrates the system of FIG. 11, after a housing 7 has been applied. The housing, similar as in FIG. 5, comprises a material embedding the integrated circuit 2 and the further circuit. The housing is arranged for allowing electric connection to the contact pads of the active side of the integrated circuit and the further circuit. Similar as in FIG. 5, the housing comprises at least one conductive via disposed outside the integrated circuit and the further circuit. The housing can for example be formed by overmolding the components with epoxy. If the pads are covered by mold, the mold must be partly opened (which is not shown in FIG. 12).

Figure 13:
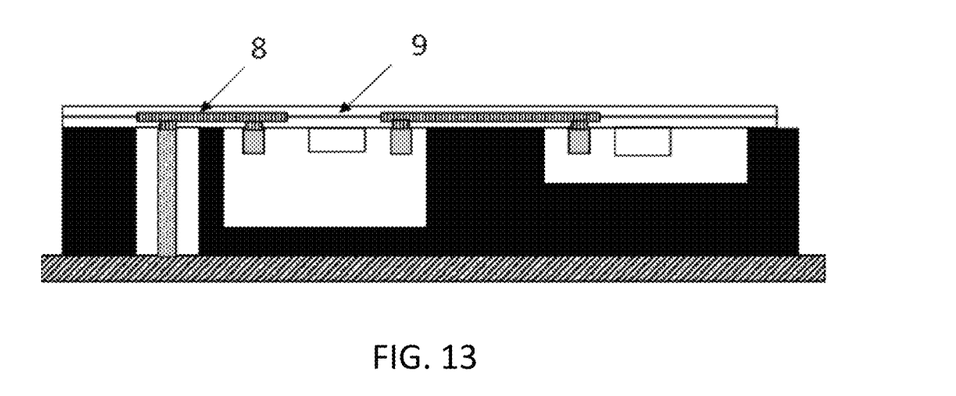

FIG. 13 illustrates the system after the carrier substrate has been transferred (similar as for FIG. 6) and after the redirection layer RDL has been manufactured. After transfer of the substrate carrier, both the first and the further circuit can make use of one big substrate, e.g. a 12 inch substrate, which will be further processed for introducing the redirection layer. The processing may be similar as described in the previous embodiments.

The redirection layer in this embodiment is used for connecting both the integrated circuit and the further circuit. Whereas in the present example use of a single via in the housing is shown, also more vias could be used. Nevertheless, in some embodiments, the integrated circuit and the further circuit may make use of the same via. Connection for the different circuits may be performed by directly connection via the redirection layer to the via, or connection may make use of common parts for the integrated circuit and the further circuit.

Figures 14, 15:
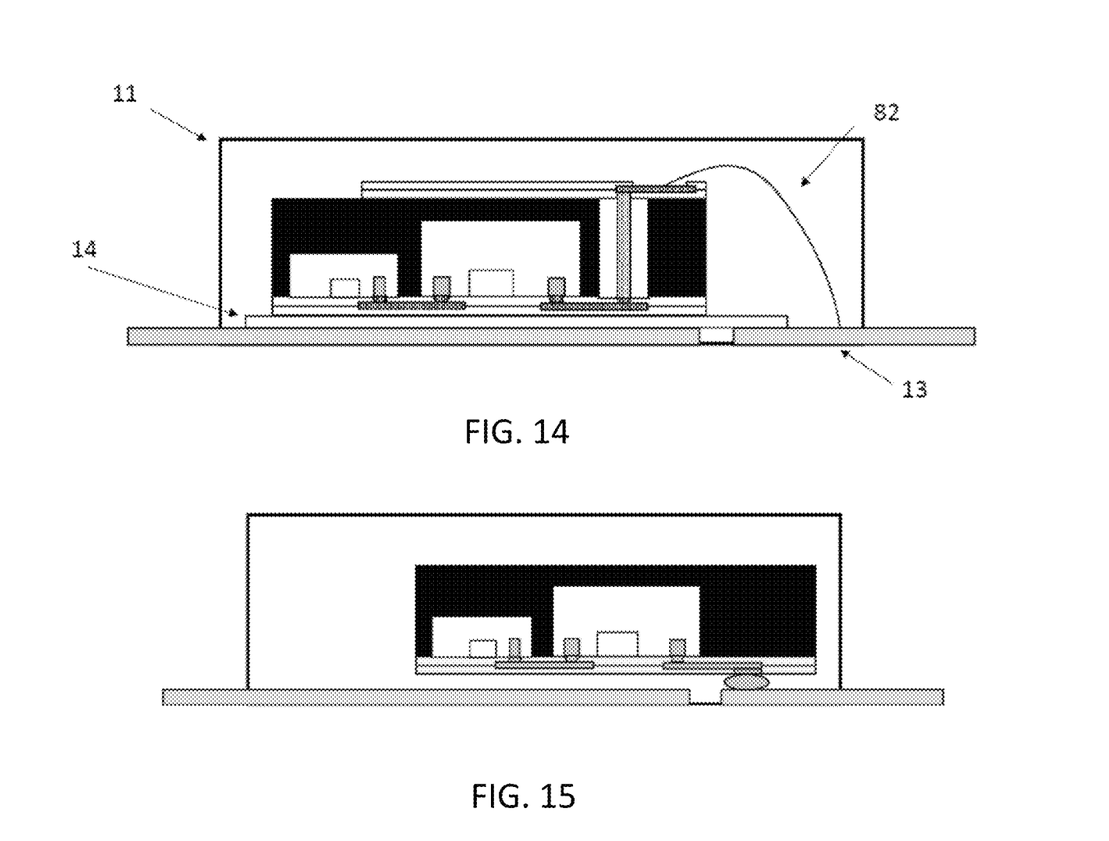
FIG. 15 and FIG. 16 illustrate different current sensors according to alternative embodiments of the present invention.

Similar as shown in FIG. 7 and FIG. 8, during the production the carrier substrate may be changed and the system may be flipped and an additional redirection layer may be patterned on the backside. FIG. 14 illustrates the assembled system, wherein the subcomponent is assembled in a standard package 11. An optional insulating tape 14 may be used. Further the wire bond connection 12 is shown connecting the backside redirection layer to a leadframe 13. Alternatively, a direct connection between the via and the leadframe 13 also may be used.

The present invention also relates to a manufacturing method for manufacturing a sensor with a first integrated circuit and a further integrated circuit. Such a manufacturing method may be similar as the manufacturing method as described above, but the method may further comprise
providing a further circuit comprising an active side and comprising a further sensing element and at least one further contact pad, and
disposing the further circuit on the carrier substrate aside the at least one integrated circuit.

Providing a housing thereby may comprise overmolding also the further circuit, the overmolding also being adapted for allowing provision of electric connection to the at least one contact pad of the active side of the further circuit. The method also may comprise providing electric connection between the at least one contact pad of the further circuit and the at least one conductive via (3), thus obtaining a sensor where electric signals generated on the active side of the further circuit can be redirected through the housing and away from the active side.

Figure 16:
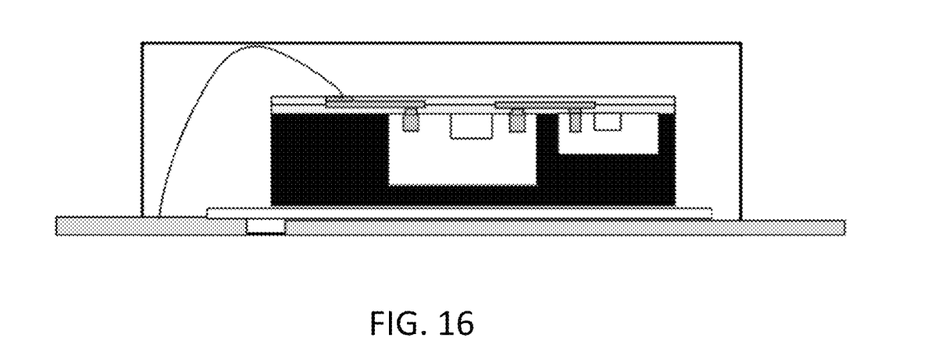

Whereas in the above, embodiments have been shown wherein connection of the different components is at least partly provided through a via, also referred to as through via, the present invention also relates to similar systems and methods for manufacturing, wherein electrical connection is performed by other means, such as for example solder bump connecting to the back side, as shown by way of example in FIG. 15 or by wire bonding to the top side, as shown in FIG. 16.

The present invention thus also relates to a current sensor comprising an integrated circuit for sensing electric currents comprising an active side, the active side comprising at least one sensing element and at least one contact pad, a housing comprising material embedding the integrated circuit, and the system being arranged for allowing electric connection to the at least one contact pad of the active side of the integrated circuit, for distributing signals from the at least one contact pad.

Such electric connections may in some embodiments make use of a redirection layer at the active side. These electric connections may in some embodiments comprise a solder bump to a leadframe, e.g. a solder bump between a redirection layer and the leadframe, or may comprise a wire bond, e.g. for a flipped component, between the active side of the integrated circuit at a top side of the component and a lead frame. The system may also comprise further circuits as describe in the above embodiments.

A corresponding manufacturing method also is provided, wherein the method does not comprise the step of providing a via through the housing, but wherein the method comprises providing a solder bump connection between the active side and the leadframe, e.g. between a redirection layer and the lead frame. Other steps of the manufacturing process may be mutates mutandis the steps as described in the manufacturing process discussed above.

More particularly, in some embodiments, the present invention also relates to a method for fabrication of a sensor, the method comprising
providing an integrated circuit comprising an active side, the active side comprising at least one sensing element and at least one contact pad,
disposing at least the integrated circuit on a carrier substrate,
providing a housing, by overmolding the integrated circuit,
and providing electric connection to the at least one contact pad thus obtaining a sensor where electric signals generated on the active side of the integrated circuit can be redirected. The latter may be performed via a redirection layer at the active side of the integrated circuit. Providing electric connection may be performed for example through solder bumping between a redirection layer at the active side and a lead frame or through wire connection, e.g. between a redirection layer at the active side of the integrated circuit and a lead frame. Alternatively solder bump connecting or wire connecting directly to the contacts also may be provided.

In embodiments of the different aspects of the present invention, the one or more dices can contain one or more sensing elements and these sensing elements may have a different sensing range and/or sensitivity. In some other embodiments, the circuit, for example the silicon die or for example the die connected to the leadframe, may not contain a sensing element but may comprise a processing circuit. In other words, one circuit may be used for processing sensing signals while one circuit, e.g. the III-V semiconductor based circuit may be used for capturing the sensing signals. The signals may be routed to the first circuit (e.g. the silicon-based circuit, for processing through the redirection layer.

In some embodiments comprising two circuits, the circuits or the dies comprising the circuits may have the same thickness, whereas in other embodiments, one of the circuits or dies comprising it may be thicker.

The invention claimed is:

1. A current sensor comprising:
   a semiconductor integrated circuit for sensing electric currents comprising an active side, the active side comprising at least one sensing element and at least one contact pad;
   a housing comprising material including mold compound embedding the semiconductor integrated circuit arranged for allowing electric connection to the at least one contact pad of the active side of the semiconductor integrated circuit;
   a primary leadframe for carrying current for sensing; and
   a set of electric contacts for signal interchange;
   wherein the housing comprises at least one conductive via disposed outside the semiconductor integrated circuit and connected to the at least one contact pad, for distributing signals from the at least one contact pad through the housing away from the active side of the semiconductor integrated circuit,
   wherein the active side of the semiconductor integrated circuit faces the primary leadframe for sensing current therefrom, the semiconductor integrated circuit being electrically isolated from the primary leadframe, the at least one contact pad of the semiconductor integrated circuit further being electrically connected to electric contacts of the set through the conductive vias, for transferring measurement signals to a secondary leadframe.

2. The current sensor according to claim 1, further comprising a redistribution layer for electrically connecting at least one contact pad to the conductive vias.

3. The current sensor according to claim 1, further comprising a redistribution layer providing electric connection between the conductive via and the electric contacts of the set.

4. The current sensor according to claim 1, further comprising isolation material between the active side and the primary leadframe.

5. The current sensor according to claim 1, further comprising isolation material comprising at least one polyimide layer and/or a polyimide tape between the conductive via and the electric contacts of the set without blocking the electric contacts.

6. The current sensor according to claim 1, wherein the sensor comprises a further circuit embedded in the housing and directly or indirectly electrically connected through the at least one conductive via.

7. A method of fabrication of a sensor comprising:
   providing a semiconductor integrated circuit comprising an active side, the active side comprising at least one sensing element and at least one contact pad;
   disposing at least the semiconductor integrated circuit on a carrier substrate;
   providing a housing including at least one conductive via and mold compound, by overmolding the semiconductor integrated circuit, the overmolding being adapted for allowing provision of electric connection to the at least one contact pad of the active side of the semiconductor integrated circuit;
   providing electric connection between the at least one contact pad and the at least one conductive via, thus obtaining a sensor where electric signals generated on the active side of the semiconductor integrated circuit can be redirected through the housing and away from the active side;
   providing a primary leadframe for providing current to be measured, and assembling the housing and the semiconductor integrated circuit thereon with the active side of the semiconductor integrated circuit facing the primary leadframe, the semiconductor integrated circuit being electrically isolated from the primary leadframe;
   providing a set of electric contacts, and electrically connecting at least one of the electric contacts to the conductive via.

8. The method according to claim 7, wherein providing a housing including at least one conductive via comprises providing at least one conductive via by fabricating at least one conductive via on a dielectric substrate, and separating a portion of dielectric material embedding conductive material, thus providing at least one prefabricated conductive via, and subsequently overmolding the semiconductor integrated circuit and the at least one conductive via.

9. The method according to claim 7, further comprising providing at least one layer of isolation material between at least the primary leadframe and the semiconductor integrated circuit, for example a layer of polyimide, and/or a polyimide tape.

10. The method according to claim 7, wherein electrically connecting the electric contacts to the conductive via comprises providing a redistribution layer on the conductive via and electrically connecting the redistribution layer to the electric contacts of the set.

11. The method according to claim 7, wherein providing electric connection between the contact pad and the conductive via comprises providing a redistribution layer in electric contact with the conductive via and the contact pad.

12. The method according to claim 11, wherein providing a redistribution layer comprises providing a redistribution layer by metal deposition, or wherein providing a redistribution layer comprises providing a passivation layer and thereafter comprises providing a redistribution layer by metal deposition.

13. The method according to claim 7, wherein the method further comprises:
   providing a further circuit comprising an active side and comprising a further sensing element and at least one further contact pad;
   disposing the further circuit on the carrier substrate aside the at least one semiconductor integrated circuit;

wherein said providing a housing comprises overmolding also the further circuit, the overmolding also being adapted for allowing provision of electric connection to the at least one contact pad of the active side of the further circuit; and wherein the method comprises providing electric connection between the at least one contact pad of the further circuit and the at least one conductive via, thus obtaining a sensor where electric signals generated on the active side of the further circuit can be redirected through the housing and away from the active side.

* * * * *